United States Patent
Ogai et al.

(10) Patent No.: US 7,688,121 B2
(45) Date of Patent: Mar. 30, 2010

(54) POWER SUPPLY VOLTAGE DETECTION CIRCUIT

(75) Inventors: Mitsuhiro Ogai, Kawasaki (JP); Isao Fukushi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/362,151

(22) Filed: Feb. 27, 2006

(65) Prior Publication Data

US 2007/0159222 A1    Jul. 12, 2007

(30) Foreign Application Priority Data

Nov. 25, 2005  (JP)  ............... 2005-340746

(51) Int. Cl.
*H02H 3/24* (2006.01)

(52) U.S. Cl. .................. 327/143; 327/198

(58) Field of Classification Search .......... 327/143, 327/77–78, 80–81, 198, 328, 545–546, 142; 326/95, 96

See application file for complete search history.

(56) References Cited

U.S. PATENT DOCUMENTS

| | | | | |
|---|---|---|---|---|
| 5,572,147 A | * | 11/1996 | Huang et al. | 326/33 |
| 5,617,047 A | * | 4/1997 | Henkels et al. | 327/142 |
| 5,877,652 A | * | 3/1999 | Oh | 327/546 |
| 6,104,221 A | * | 8/2000 | Hoon | 327/143 |
| 6,184,724 B1 | * | 2/2001 | Lin | 327/80 |
| 6,404,236 B1 | * | 6/2002 | Bernstein et al. | 326/98 |
| 6,538,482 B2 | * | 3/2003 | Hirano et al. | 327/143 |
| 6,791,373 B2 | * | 9/2004 | Oyama | 327/78 |
| 6,960,939 B2 | * | 11/2005 | Ngo | 326/95 |
| 7,142,019 B2 | * | 11/2006 | Mair et al. | 326/96 |
| 7,425,854 B2 | * | 9/2008 | Suzuki | 327/198 |
| 7,545,186 B2 | * | 6/2009 | Suzuki et al. | 327/143 |
| 2005/0275437 A1 | * | 12/2005 | Suzuki et al. | 327/143 |

FOREIGN PATENT DOCUMENTS

| | | |
|---|---|---|
| JP | 5-233099 | 9/1993 |
| JP | 3571729 | 7/2004 |

* cited by examiner

*Primary Examiner*—Lincoln Donovan
*Assistant Examiner*—Patrick O'Neill
(74) *Attorney, Agent, or Firm*—Arent Fox LLP

(57) ABSTRACT

A power supply voltage detection circuit is provided including: a first switch to connect between a power supply voltage terminal and a first terminal according to a power supply voltage detection signal and an external signal; a second switch to connect between a reference potential terminal and a second terminal according to the power supply voltage detection signal and the external signal; a first resistance connected between the second terminal and the power supply voltage terminal; and a third switch connecting between the first terminal and the reference potential terminal according to a voltage of the second terminal; and an output circuit outputting the power supply voltage detection signal based on a signal from the first terminal.

6 Claims, 9 Drawing Sheets

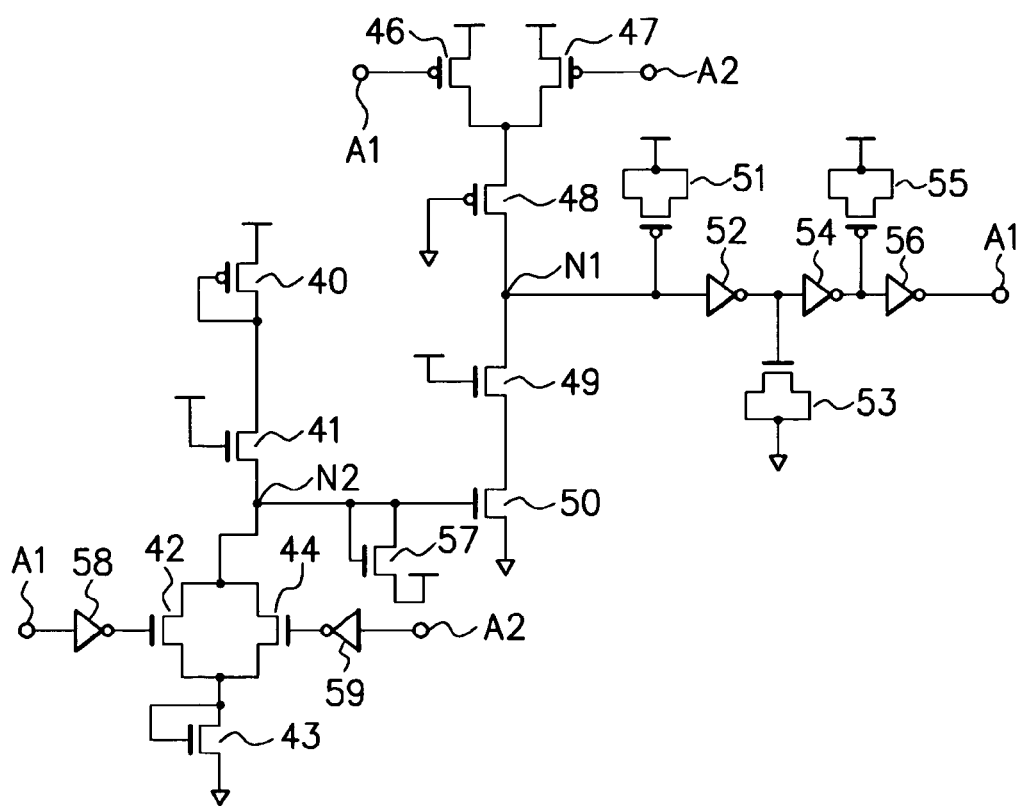
F I G. 1

F I G. 3
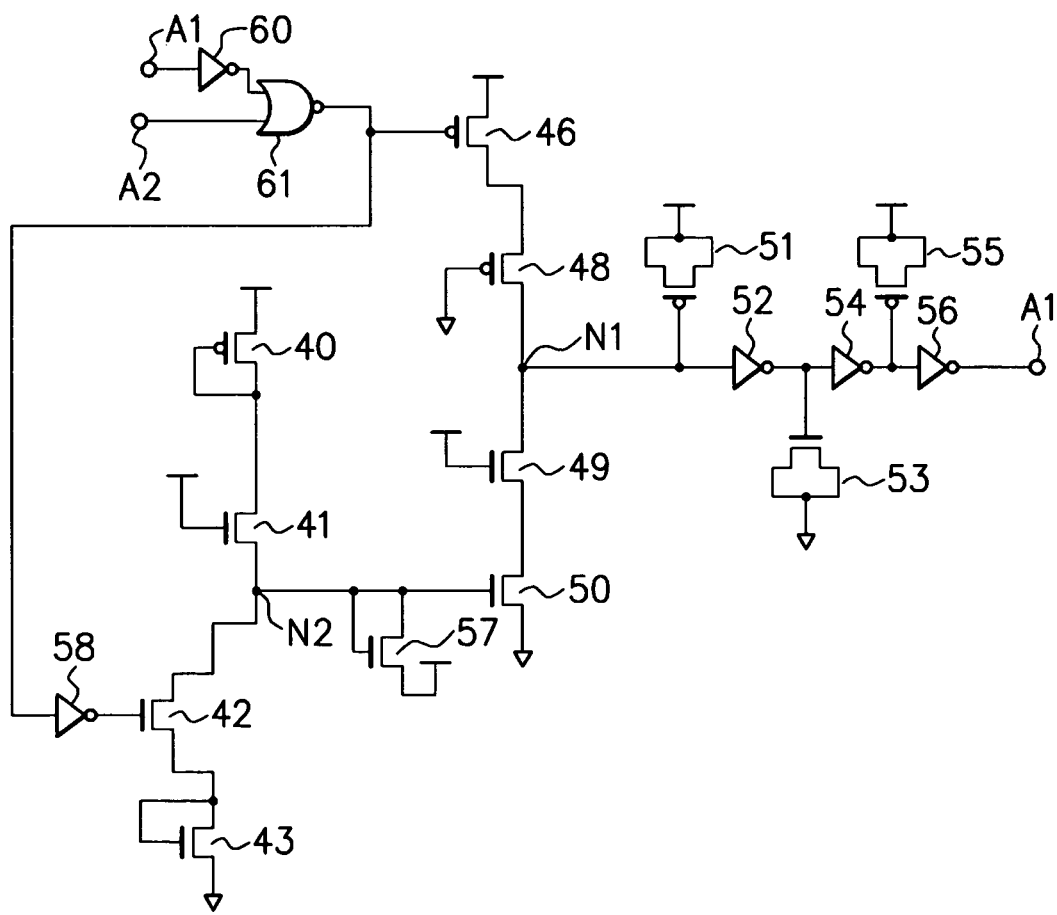

F I G. 5
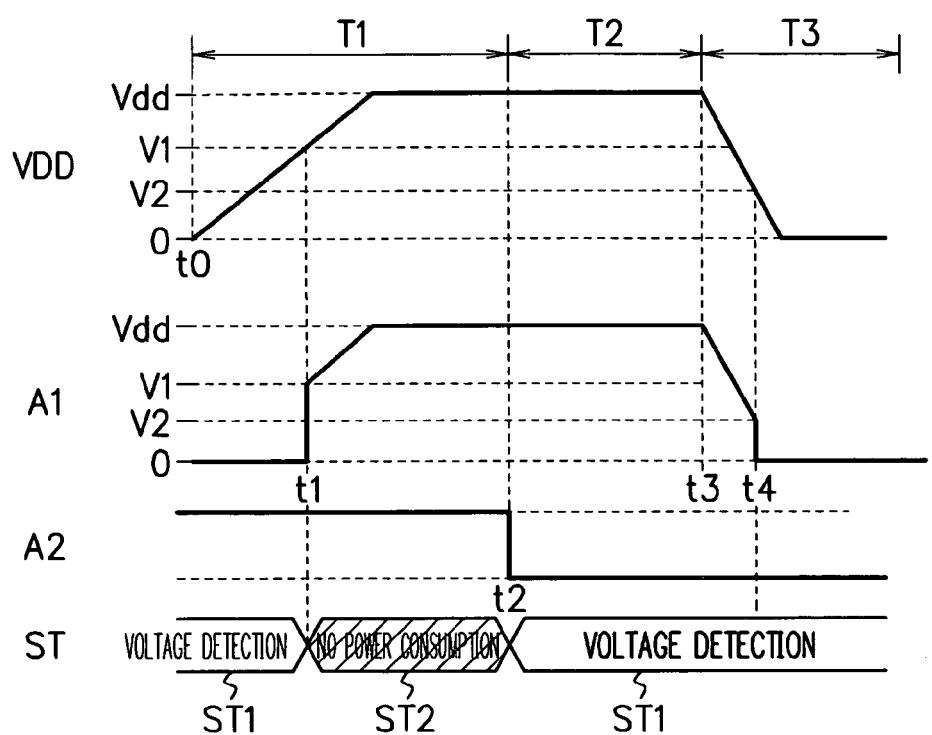

POWER SUPPLY VOLTAGE DETECTION CIRCUIT

CROSS-REFERENCE TO RELATED APPLICATIONS

This application is based upon and claims the benefit of priority from the prior Japanese Patent Application No. 2005-340746, filed on Nov. 25, 2005, the entire contents of which are incorporated herein by reference.

BACKGROUND OF THE INVENTION

1. Field of the Invention

The present invention relates to a power supply voltage detection circuit.

2. Description of the Related Art

A power supply voltage detection circuit is a circuit outputting some kind of clear level-detection circuit signal when a power supply voltage reaches a certain prescribed voltage or larger, or a circuit outputting some kind of clear level detection signal during only a term having a prescribed power supply voltage or larger, and it is widely installed on a semiconductor device to prevent operation failures due to a low power supply voltage.

FIG. 9 is a circuit diagram showing a configuration example of a power supply voltage detection circuit. Hereinafter, a MOS field-effect transistor will be simply referred to as a transistor. In a P-channel transistor 8, a source is connected to a power supply voltage terminal VDD, a gate is connected to a ground terminal (reference potential terminal), and a drain is connected to a node terminal N11. In an N-channel transistor 9, a source is connected to a drain of an N-channel transistor 10, a gate is connected to the power supply voltage terminal VDD, and a drain is connected to the node terminal N11. In the N-channel transistor 10, a source is connected to the ground terminal, a gate is connected to a node terminal N12, and the drain is connected to the source of the N-channel transistor 9 as described above. It should be noted that the size of the P-channel transistor 8 is preset to have higher resistance value while connected compared to that of the N-channel transistor 9. In an N-channel transistor 17, a gate and a source are connected to the node terminal N12, and a drain is connected to the power supply voltage terminal VDD.

In a P-channel transistor 4, a source is connected to the power supply voltage terminal VDD, and a gate and a drain are connected to a drain of an N-channel transistor 5. In the N-channel transistor 5, a source is connected to the node terminal N12, a gate is connected to the power supply voltage terminal VDD, and a drain is connected to the gate and the drain of the P-channel transistor 4. In an N-channel transistor 6, a source is connected to the ground terminal, and a gate and a drain are connected to the node terminal N12. A node terminal N11 is connected to a power supply voltage detection signal terminal B1 via inverters 12, 14 and 16. The power supply voltage detection signal terminal B1 outputs a power supply voltage detection signal which increases to a high level when a power supply voltage of a prescribed value or higher is detected.

Respective gates of a P-channel transistor 11, an N-channel transistor 13 and a P-channel transistor 15 are connected to respective inputs of the inverters 12, 14 and 16. Drains and sources of the P-channel transistors 11 and 15 are connected to the power supply voltage terminal VDD and the P-channel transistors 11 and 15 serve as capacitors. A drain and a source of the N-channel transistor 13 are connected to the ground terminal and the N-channel transistor 13 serves as a capacitor. The capacitors 11, 13, and 15 serve to delay signal fluctuation of the node terminal N11.

Functions in the power supply voltage detection circuit will be explained when power supply voltage at the power supply voltage terminal VDD is raised from 0 volts to a prescribed power supply voltage level. The power supply voltage terminal VDD and the node terminal N11 are conducting (in a connected state) through the transistor 8 immediately after raising of the power supply voltage, and the voltage at the node terminal N11 is nearly equal to the power supply voltage. At this time, though the transistor 5 is already conducting, the voltage at the node terminal N12 is lower than the power supply voltage by at least the amount of threshold voltage because the node terminal N12 is short-circuited with the drain and the gate of the transistor 4. In addition, though the passage of an electric current to the ground terminal by the transistor 6 raises voltage according to the voltage of the power supply voltage, it does not rise so much as to exceed the threshold voltage of the transistor 10. As a result, the node terminal N11 maintains the power supply voltage as is, and the power supply voltage detection signal terminal B1 stays at a ground level.

Rising of a power supply voltage of the power supply voltage terminal VDD makes the potential of the node terminal N12 further increase, and the potential of the node terminal N12 finally exceeds the threshold voltage of the transistor 10. Then, voltage increase at the power supply voltage terminal VDD by the transistor 8 and voltage drop at the ground terminal by the transistor 10 occur simultaneously in the node terminal N11. However, since the resistance of the transistors 9 and 10 are lower than that of the transistor 8, the voltage of the node terminal N11 finally decreases toward ground. As a result, the power supply voltage detection signal terminal B1 outputs a high-level voltage equal to the power supply voltage. From then on, the voltage of the power supply voltage detection signal terminal B1 follows a power supply voltage level. A power supply voltage at time when the power supply voltage detection signal terminal B1 outputs a power supply voltage detection signal is the voltage of the power supply voltage detection signal.

When the power supply voltage decreases, movement is completely opposite to the case when it increases. In other words, when the voltage of the power supply voltage is decreased to 0 volts from a prescribed value, the power supply voltage is detected at the initial state, the voltage of the power supply voltage detection signal terminal B1 is at a power supply voltage level, and the transistor 10 is in an ON-state. However, when a power supply voltage drops, voltage of the node terminal N12 is lowered at the same time, and finally it becomes equal to or lower than the threshold voltage of the transistor 10 at time of reaching the power supply voltage detection voltage, and the transistor 10 is OFF. As a result, a path to lower the voltage of the node terminal N11 toward ground is disconnected. However, since there is a source supply path from the power supply voltage terminal VDD in the node terminal N11, the node terminal N11 is in a power supply voltage level. As a result, a signal from the power supply voltage detection signal terminal B1 becomes ground level.

In the power supply voltage detection circuit, upon detection of the power supply voltage, a path from the power supply voltage terminal VDD to the ground terminal monitors a power supply voltage level of the power supply voltage terminal VDD until the power supply voltage detection is finished by continuing to pass an electric current through a path passing through the transistors 4, 5 and 6, and a path passing through the transistors 9 and 10. That is, it means that power consumption is always carried out.

FIG. 10 is a circuit diagram showing a configuration example of another power supply voltage detection circuit. The circuit in FIG. 10 is an addition of transistors 23 and 26, and an inverter 37 to the circuit in FIG. 9. In a P-channel transistor 26, a source is connected to the power supply voltage terminal VDD, a gate is connected to the power supply voltage detection signal terminal B1, and a drain is connected to the source of the P-channel transistor 8. In an N-channel transistor 23, a source is connected to the drain and gate of the N-channel transistor 6, a gate is connected to the power supply voltage detection signal terminal B1 via an inverter 37, and a drain is connected to the node terminal N12.

Points of the circuit functions in FIG. 10 different from the circuit functions in FIG. 9 are explained. When a power supply voltage becomes a prescribed value or more, a signal from the power supply voltage detection signal terminal B1 becomes the same value in voltage as the power supply voltage. At this time, the gate voltage of the transistor 26 becomes the same as the power supply voltage. A gate voltage of the transistor 23 gets at the ground level. Accordingly, the transistors 23 and 26 become OFF so that the path between the power supply voltage terminal VDD and the ground terminal is completely disconnected.

As a result, the power supply voltage detection circuit cannot detect the power supply voltage, even when the power supply voltage becomes less than a prescribed value, since the signal from the power supply voltage detection signal terminal B1 follows the power supply voltage level unless electric charges completely come out from the node terminals N11 and N12 which are kept in a floating state by a leakage current. In other words, it means that the power supply voltage detection circuit works only when the power supply voltage rises from 0 volts to a prescribed value. The principle will be explained. In order to monitor a power supply voltage by the power supply voltage detection circuit, it is required that the voltage of the node terminal N12 be adjusted by the power supply voltage so as to control ON/OFF of the transistor 10, and at the same time, that the voltage be always supplied from the power supply voltage terminal VDD into the node terminal N11, and when the transistor 10 is OFF, that the voltage of the node terminal N11 be increased to the power supply voltage level. However, when once a voltage of the power supply voltage detection signal terminal B1 becomes the power supply voltage, the power supply voltage supply path from the power supply voltage terminal VDD is disconnected in the node terminal N11 and the node terminal N11 becomes a floating at a low level, and the node terminal N11 only receives a voltage drop due to a coupling effect proportional to the power supply voltage by the capacitor 11. Accordingly, the node terminal N11 as an input of the inverter 12 is always looked as a low level seen from the power supply voltage level, and a voltage of the power supply voltage detection signal terminal B1 always follows the power supply voltage level without being based on a power supply voltage. In order to solve this problem, it is required that the power supply voltage once become 0 volts and electric charges in the floating node terminals N11 and N12 must completely come out by a leakage current or the like. Furthermore, it is necessary that the voltage of the node terminal N12 should become the threshold voltage of the transistor 10 or less to make the transistor 10 OFF. Note that the node terminal N12 is provided by the transistor 17 with a path to draw the voltage away until the threshold voltage of the transistor 10 is reached.

In a Patent Document 1 below, described is a power-on-reset circuit which can be used to disable functions such as entering to a special test mode during a power up period.

(Patent Document 1) Japanese Patent No. 3571729

The following problems exist in the power supply voltage detection circuit. Though the power supply voltage detection circuit in FIG. 9 can always keep track of a power supply voltage condition, i.e., can always monitor the power supply voltage, the path between the power supply voltage terminal VDD and the ground terminal always comes in a connection state even after the power supply voltage becomes a prescribed value or larger, and electric power is always consumed. This raises a problem from the view point of low power consumption which is sought by semiconductor devices.

In the power supply voltage detection circuit in FIG. 10, since the power supply voltage detection signal disconnects all paths between the power supply voltage terminal VDD and the ground terminal when the power supply voltage first rises from 0 volts, power consumption occurs only at the start of applying the power supply voltage. However, in order to carry out power supply voltage detection again after the power supply voltage is raised, it is necessary that the power supply voltage should once become 0 volts, and electric charges in the floating node terminals N11 and N12 must completely come out, and therefore, it becomes impossible to detect a power supply voltage, for instance, for a state that the power supply voltage is below a prescribed value. Accordingly, if a power supply voltage drops instantaneously to 0 volts during operation of a semiconductor device, the power supply voltage detection circuit cannot detect it, which raises a problem in that measures protecting against, for instance, lowering of the power supply voltage cannot be taken completely.

Generally, when the power supply voltage detection circuit is required in a semiconductor device and the semiconductor device is in some operation while power is on, sometimes there is no practical trouble during standby if the power supply voltage detection circuit is not in operation. A semiconductor device is not always in a power-on, but sometimes spends a great proportion of time in standby.

SUMMARY OF THE INVENTION

An object of the present invention is to provide a power supply voltage detection circuit which can detect rising and falling of a power supply voltage, and, at the same time, can suppress power consumption.

According to a point of view of the present invention, a power supply voltage detection circuit includes: a first switch to connect between a power supply voltage terminal and a first terminal according to a power supply voltage detection signal and an external signal; a second switch to connect between a reference potential terminal and a second terminal according to the power supply voltage detection signal and the external signal; a first resistance connected between the second terminal and the power supply voltage terminal; a third switch to connect between the first terminal and the reference potential terminal according to a voltage of the second terminal, and an output circuit to output the power supply voltage detection signal based on a signal from the first terminal.

BRIEF DESCRIPTION OF THE DRAWINGS

FIG. 1 is a circuit diagram showing a configuration example of a power supply voltage detection circuit according to a first embodiment of the present invention;

FIG. 3 is a circuit diagram showing a configuration example of a power supply voltage detection circuit according to a second embodiment of the present invention;

FIG. 5 is a timing chart showing an operational example of the power supply voltage detection circuit in FIG. 4;

DETAILED DESCRIPTION OF THE PREFERRED EMBODIMENTS

First Embodiment

Figure 2:
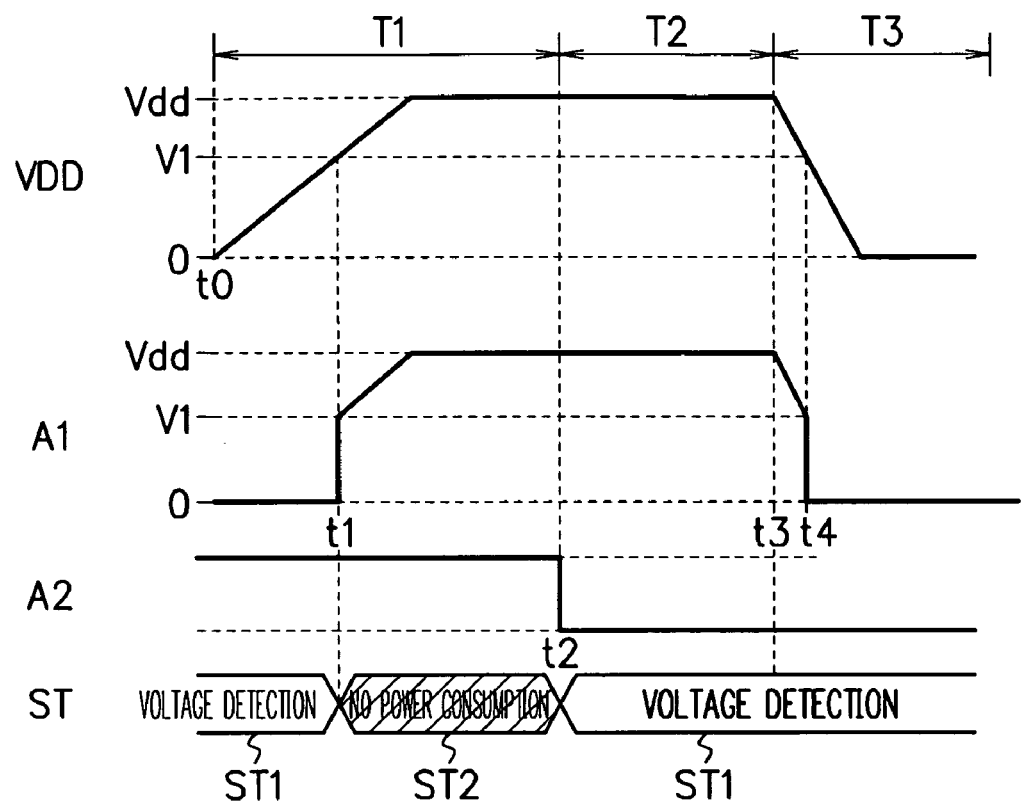
FIG. 2 is a timing chart showing an operational example of the power supply voltage detection circuit in FIG. 1.

FIG. 1 is a circuit diagram showing a configuration example of a power supply voltage detection circuit according to a first embodiment of the present invention. The power supply voltage detection circuit is a semiconductor device. Hereinafter, a MOS field-effect transistor is merely referred to as a transistor. In a P-channel transistor 46, a source is connected to a power supply voltage terminal VDD, a gate is connected to a power supply voltage detection signal terminal A1, and a drain is connected to a source of a P-channel transistor 48. In a P-channel transistor 47, a source is connected to the power supply voltage terminal VDD, a gate is connected to an external signal terminal A2, and a drain is connected to the source of the P-channel transistor 48. In the P-channel transistor 48, the source is connected to the drain of the P-channel transistor 46 and the drain of the transistor 47 as described above, and a gate is connected to a ground terminal (reference potential terminal), and a drain is connected to a node terminal N1 and the P-channel transistor 48 serves as a resistance. In an N-channel transistor 49, a source is connected to a drain of an N-channel transistor 50, a gate is connected to the power supply voltage terminal VDD, and a drain is connected to the node terminal N1 and the N-channel transistor 49 serves as a resistance. In the N-channel transistor 50, a source is connected to the ground terminal, a gate is connected to a node terminal N2, and the drain is connected to the source of the N-channel transistor 49 as described above. It should be noted that the size of the P-channel transistor 48 is set in advance so that the resistance of the P-channel transistor 48 at time of connection is higher than that of the N-channel transistor 49. In an N-channel transistor 57, a gate and a source are connected to the node terminal N2, and a drain is connected to the power supply voltage terminal VDD.

In a P-channel transistor 40, a source is connected to the power supply voltage terminal VDD, and a gate and a drain are connected to a drain of an N-channel transistor 41. In the N-channel transistor 41, a source is connected to the node terminal N2, a gate is connected to the power supply voltage terminal VDD, and the drain is connected to the gate and the drain of the P-channel transistor 40 as described above, and the N-channel transistor 41 serves as a resistance. In an N-channel transistor 42, a source is connected to a drain and a gate of an N-channel transistor 43, a gate is connected to the power supply voltage detection signal terminal A1 via an inverter 58, and a drain is connected to the node terminal N2. In the N-channel transistor 43, a source is connected to the ground terminal, and the gate and the drain are connected to the source of the N-channel transistor 42 as described above. In an N-channel transistor 44, a source is connected to the drain and the gate of the N-channel transistor 43, a gate is connected to the external signal terminal A2 via an inverter 59, and a drain is connected to the node terminal N2. The node terminal N1 is connected to the power supply voltage detection signal terminal A1 via inverters 52, 54 and 56. The inverters 52, 54, and 56 output respective input signals by reverse amplification. As a result, a voltage level of the power supply voltage detection signal terminal A1 is a reversed level of a voltage level of the node terminal N1.

Respective gates of a P-channel transistor 51, an N-channel transistor 53, and a P-channel transistor 55 are connected to respective inputs of the inverters 52, 54, and 56. Drains and sources of the P-channel transistors 51 and 55 are connected to the power supply voltage terminal VDD, and the P-channel transistors 51 and 55 serve as capacitors. In the N-channel transistor 53, a drain and a source are connected to the ground terminal and the N-channel transistor 53 serves as a capacitor. The capacitors 51, 53 and 55 are to delay fluctuation of the signal from the node terminal N1.

FIG. 2 is a timing chart showing a functional example of the power supply voltage detection circuit in FIG. 1, and showing voltages of the power supply voltage terminal VDD, power supply voltage detection signal terminal A1 and external signal terminal A2, and a condition ST of the power supply voltage detection circuit.

A first term T1 is a term from the time t0 to the time t2, during which a power supply voltage of the power supply voltage terminal VDD is increased from 0 volts to a prescribed voltage Vdd. In the first term T1, a high level external signal is inputted to the external signal terminal A2. At time t0 in an initial state, all nodes in the circuit are at ground level. Immediately following an initial rise in the voltage of the power supply voltage terminal VDD, the voltage of the power supply voltage detection signal terminal A1 is at ground, and the transistors 42 and 46 are in a conduction state. The power supply voltage terminal VDD and the node terminal N1 are connected via the transistors 46 and 48. The node terminal N1 has nearly the same voltage as that of the power supply voltage terminal VDD. The transistor 41 is already conducting at this time. The voltage of the node terminal N2 is lower than that of the power supply voltage terminal VDD by at least a threshold voltage because the drain and the gate of the transistor 40 are short circuited, and the transistor 42 is conducting. Though the voltage of the node terminal N2 rises according to the voltage of the power supply voltage terminal VDD due to passage of electric current through the ground terminal by the transistor 43, it does not increase so much as to exceed the threshold voltage of the transistor 50. As a result, the voltage of the node terminal N2 is kept s the same voltage as that of the power supply voltage terminal VDD, and the voltage of the power supply voltage detection signal terminal A1 remains at ground level as is. The potential of the node terminal N2 further keeps on increasing by rising of the voltage of the power supply voltage terminal VDD. When the power supply voltage terminal VDD finally reaches detection voltage V1 at time t1, the potential of the node terminal N2 exceeds the threshold voltage of the transistor 50. Then, in the node terminal N1, voltage increase through a path from the power supply voltage terminal VDD via the transistors 46 and 48, and voltage down by a path to the ground terminal via the transistors 49 and 50 occur simultaneously. However, since the resistance of a path between the node terminal N1 and the ground terminal is lower than the resistance between the power supply voltage terminal VDD and the node terminal N1, the voltage of the node terminal N1 finally falls down toward ground. As a result, the voltage of the power supply voltage detection signal terminal A1 follows the voltage of the power supply voltage terminal VDD. A power supply voltage level of the power supply voltage detection signal terminal A1 is supplied to the gate of the transistor 46. The inverter 58 reverses the power supply voltage level of the power supply voltage detection signal terminal A1, and supplies the ground level to the gate of the transistor 42. Thereby, the transistors 42 and 46 are switched OFF, the path between the power supply voltage terminal VDD and the ground terminal in the power supply voltage detection circuit is completely disconnected, so that electric power is not consumed. The power supply voltage detection circuit becomes a power supply voltage detecting operation state ST1 during the time from t0 to t1, and becomes a state ST2 during the time from t1 to t2, during which power supply voltage detecting operation is not performed and power is not consumed.

Then, it goes to a second term T2. The second term T2 is a term from the time t2 to the time t3, and a low level external signal is inputted to the external signal terminal A2. When the external signal terminal A2 gets a low level, the inverter 59 reverses a low level of the external signal terminal A2 and outputs a high level to the gate of the transistor 44. Thereby, the transistors 44 and 47 become ON, and the path between the power supply voltage terminal VDD in the power supply voltage detection circuit and the ground terminal is made live again. The power supply voltage detection circuit is a power supply voltage detecting operation state ST1 during the second term T2.

Then, it goes to a third term T3. The third term T3 is a term after the time t3, and the power supply voltage terminal VDD falls from the voltage Vdd to 0 volts. The external signal terminal A2 remains at a low level. At this time, it works completely oppositely compared with the case of increasing the power supply voltage. That is, when the voltage of the power supply voltage terminal VDD starts falling from a prescribed value Vdd toward 0 volts at time t3, the voltage of the power supply voltage detection signal terminal A1 is at the power supply voltage level, and the transistor 50 is in an ON state. However, as the voltage of the power supply voltage terminal VDD starts falling, the voltage of the node terminal N2 falls. When the voltage of the power supply voltage terminal VDD finally falls to the detection voltage V1 at time t4, the voltage of the node terminal N2 falls to the threshold voltage of the transistor 50 or lower, and the transistor 50 is OFF. As a result, a path to lower the voltage of the node terminal N1 to ground is disconnected. On the other hand, since there exists a power supply voltage supply path from the power supply voltage terminal VDD via the transistors 47 and 48 in the node terminal N1, the node terminal N1 is at the power supply voltage level. As a result, the power supply voltage detection signal terminal A1 is at the ground level. The power supply voltage detection circuit is in a power supply voltage detecting operation state ST1 during the third term T3, the same as during the second term T2.

As described above, the transistors 42, 44, 46, 47 and 50 serve as switches. The switches 46 and 47 are connected in parallel between the power supply voltage terminal VDD and the node terminal N1, and serve as switches to connect between the power supply voltage terminal VDD and the node terminal N1 according to signals from the power supply voltage detection signal terminal A1 and the exterior signal terminal A2. The switch 46 connects between the power supply voltage terminal VDD and the node terminal N1 according to the signal from the power supply voltage detection signal terminal A1. The switch 47 connects between the power supply voltage terminal VDD and the node terminal N1 according to the signal from the external signal terminal A2. The switches 46 and 47 are connected to the node terminal N1 via the same resistance 48. Then, the detection voltage V1 at the time of power supply voltage leading edge at time t1 becomes the same as the detection voltage V1 at a time of power supply voltage falling edge at time t4.

The switches 42 and 44 are connected in parallel between the ground terminal and the node terminal N2 and are switches to connect between the ground terminal (reference potential terminal) and the node terminal N2 according to the signal from the power supply voltage detection signal terminal A1 and the external signal terminal A2. The switch 42 connects between the ground terminal and the node terminal N2 according to a signal from the power supply voltage detection signal terminal A1. The switch 44 connects between the ground terminal and the node terminal N2 according to a signal from the external signal terminal A2.

The resistance 41 is connected between the node terminal N2 and the power supply voltage terminal VDD. The switch 50 is a switch to connect between the node terminal N1 and the ground terminal according to the voltage of the node terminal N2. The inverters 52, 54 and 56, and the capacitors 51, 53 and 55 are output circuits to output a power supply voltage detection signal to the power supply voltage detection signal terminal A2 based on a signal from the node terminal N1.

The signal from the power supply voltage detection signal terminal A1 is a signal to show whether or not the power supply voltage is equal to a prescribed value V1 or more. The switches 42 and 46 perform connection when a signal from the power supply voltage detection signal terminal A1 is low (below the prescribed value V1 of the power supply voltage). In addition, when the signal from the power supply voltage detection signal terminal A1 is high (the power supply voltage is equal to or greater than the prescribed value V1 of the power supply voltage), the switches 42 and 46 perform connection when the signal from the external signal terminal A2 is low (instruction for connection) and disconnect when it is high (no instruction for connection).

According to the present embodiment, the initial state at the time of starting to raise the supply voltage corresponds to time from t0 to t1 in FIG. 2, where a power supply voltage detecting operation is performed. At time from t1 to t2, though no power supply voltage detecting operation is performed, since a path between the power supply voltage terminal VDD and the ground terminal is disconnected, most of the power consumption disappears. After the time t2, detection of the power supply voltage can be performed again by bringing the path between the power supply voltage terminal VDD and the ground terminal into conduction again by the external signal. Furthermore, since the timing of time t2 can be changed voluntarily by an external signal, it becomes possible to control the term necessary to detect the power supply voltage by the external signal, and in addition, suppress power consumption during the term during which no detection of the power supply voltage is required. The external signal is, for instance, a standby/active signal of other functional blocks (for instance, a semiconductor memory), a high level means a standby signal and a low level means an active signal.

Second Embodiment

FIG. 3 is a circuit diagram showing a configuration example of the power supply voltage detection circuit according to the second embodiment of the present invention. Points in the present embodiment different from the first embodiment will be explained hereinafter. The present embodiment provides a circuit in which the transistors 47 and 44, and the inverter 59 in the first embodiment (FIG. 1) are removed, and the gate of the transistor 46 and the input of the inverter 58 in FIG. 1 are modified as follows. The inverter 60 outputs a signal from the power supply voltage detection signal terminal A1 by reversing thereof. A NOR circuit 61 outputs a NOR signal of an output signal from the inverter 60 and a signal from the external signal terminal A2. The inverter 58 outputs an output signal from the NOR circuit 61 by reversing thereof. An output signal from the NOR circuit 61 is inputted to the gate of the transistor 46. An output signal of the inverter 58 is inputted to the gate of the transistor 42.

As described above, the transistor 46 is a switching transistor in which a logical operation signal obtained by logical operation of signals from the power supply voltage detection signal terminal A1 and the external signal terminal A2 is inputted to the gate. The transistor 42 is a switching transistor in which a reverse signal of the logical operation signal is inputted to the gate.

The function of the power supply voltage detection circuit of the present embodiment is the same as the function of the first embodiment. A difference between both embodiments is to control connection/disconnection of the transistors 42 and 46 in a path between the power supply voltage terminal VDD and the ground terminal. It should be noted that a logical circuit to control the gate voltage of the transistor 46 and the gate voltage of the transistor 42 shown in the second embodiment is only an example, and it is natural that a circuit may be constructed with an arbitrary logic circuit if the same result can be obtained with the present logic.

Third Embodiment

Figure 4:
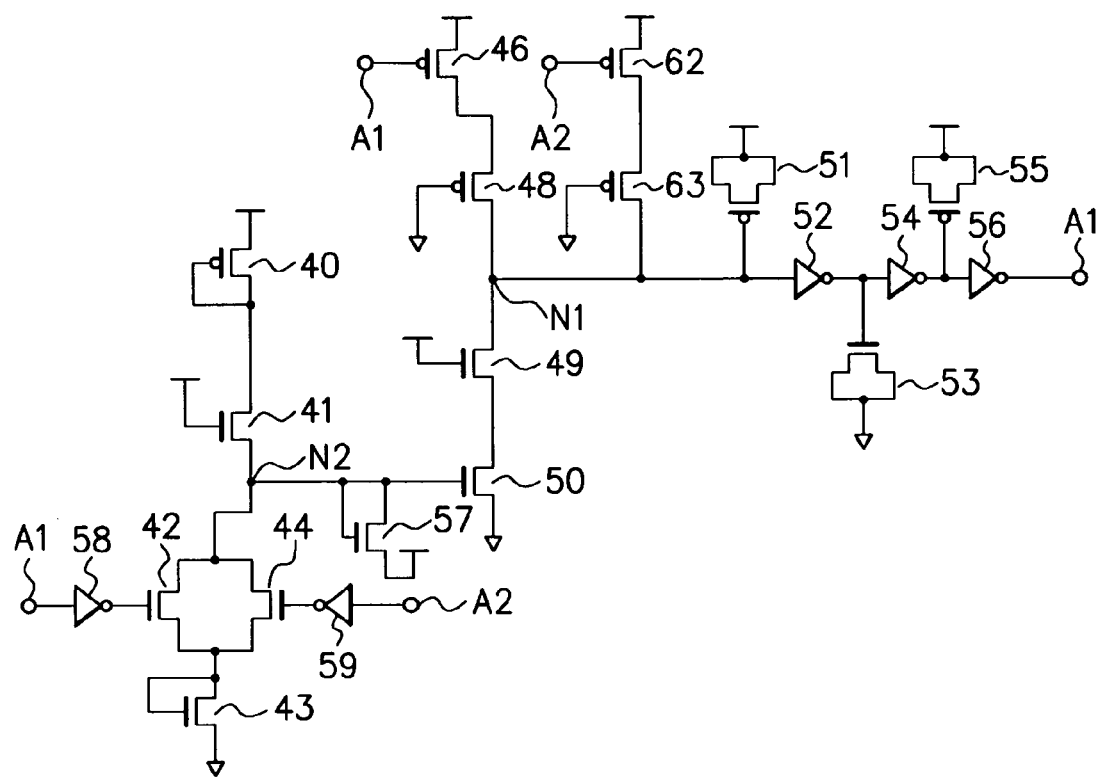
FIG. 4 is a circuit diagram showing a configuration example of a power supply voltage detection circuit according to a third embodiment of the present invention.

FIG. 4 is a circuit diagram showing a configuration example of the power supply voltage detection circuit according to the third embodiment of the present invention. Points in the present embodiment different from the first embodiment will be explained hereinafter. The present embodiment provides a circuit in which the transistor 47 in the first embodiment (FIG. 1) is taken away and transistors 62 and 63 are added. In the P-channel transistor 62, a source is connected to the power supply voltage terminal VDD, a gate is connected to the external signal terminal A2, and a drain is connected to a source of the P-channel transistor 63 and the P-channel transistor 62 serves as a switch. In the P-channel transistor 63, a source is connected to the drain of the P-channel transistor 62, a gate is connected to the ground terminal, and a drain is connected to the node terminal N1 and the P-channel transistor 63 serves as a resistance.

In the present embodiment, a path from the power supply voltage terminal VDD to the node terminal N1 includes a path passing through the transistors 46 and 48, and a path passing through the transistors 62 and 63 in parallel. It is possible to adjust a detection voltage V1 at time of power supply voltage leading edge by controlling a resistance value of the transistor 48 by adjusting the size of the transistor 48. It is possible to adjust a detection voltage V2 at time of power supply voltage falling edge by controlling a resistance value of the transistor 63 by adjusting the size of the transistor 63.

FIG. 5 is a timing chart showing an operation example of the power supply voltage detection circuit in FIG. 4. Points in the present embodiment different from the first embodiment (FIG. 2) will be explained hereinafter. The first term T1 is a period to detect the power supply voltage leading edge, and operates in the same manner as in the first embodiment. When the voltage of the power supply voltage terminal VDD rises to the detection voltage V1, the power supply voltage detection signal terminal A1 outputs at a high level (power supply voltage level) at time t1. At this time, since the path between the power supply voltage terminal VDD and the node terminal N1 is in conduction via the transistors 46 and 48, the detection voltage V1 is determined according to a resistance value of the transistor 48. During the second term T2, a signal from the external signal terminal A2 is low (ground), the transistor 62 is brought into conduction, and the path between the power supply voltage terminal VDD and the ground terminal is brought into conduction via the transistors 62 and 63. During the third term T3, the power supply voltage terminal VDD falls from a prescribed voltage Vdd to 0 volts. At time t4, when voltage of the power supply voltage terminal VDD falls to the detection voltage V2, the power supply voltage detection signal terminal A1 outputs a low level. At this time, after the transistor 50 is disconnected, a path pulling up the node terminal N1 to a power supply voltage level changes to the path between the power supply voltage terminal VDD and the node terminal N1 via the transistors 62 and 63, different from the path at time of leading edge of the power supply voltage during the first term T1. Accordingly, the detection voltage V2 is determined according to the resistance value of the transistor 63. It becomes possible to change the detection voltage V1 at time of leading edge of the power supply voltage and the detection voltage V2 at time of falling edge of the power supply voltage according to the resistance of the transistor 63.

As described above, the switches 46 and 62 are connected between the power supply voltage terminal VDD and the node terminal N1 in parallel, and are connected to the node terminal N1 via different resistances 48 and 63. The switch 46 connects between the power supply voltage terminal VDD and the node terminal N1 according to a signal from the power supply voltage detection signal terminal A1. The switch 62 connects between the power supply voltage terminal VDD and the node terminal N1 according to a signal from the external signal terminal A2.

Fourth Embodiment

Figure 6:
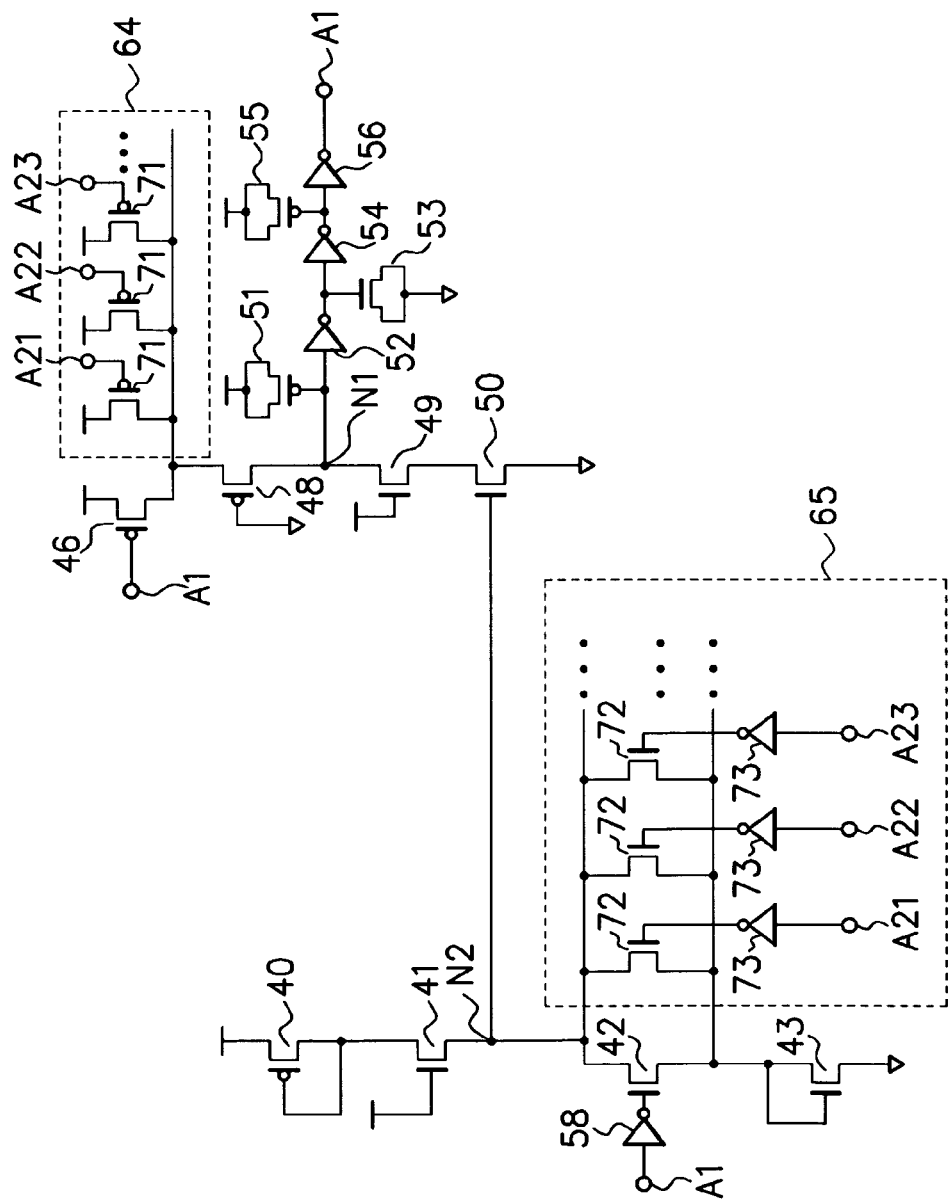
FIG. 6 is a circuit diagram showing a configuration example of a power supply voltage detection circuit according to a fourth embodiment of the present invention.

FIG. 6 is a circuit diagram showing a configuration example of the power supply voltage detection circuit according to the fourth embodiment of the present invention. Points in the present embodiment different from the first embodiment will be explained hereinafter. The present embodiment provides a circuit in which the transistors 44 and 47, and the inverter 59 in the first embodiment (FIG. 1) are taken away, and switch circuits 64 and 65 are added.

The switch circuit 64 includes a plurality of P-channel transistors 71 connected between sources of the power supply voltage terminal VDD and the transistor 48 in parallel. Signals from external signal terminals A21 to A23, etc. are inputted respectively to gates of a plurality of the transistors 71.

The switch circuit 65 includes a plurality of N-channel transistors 72 connected in parallel between sources of the node terminal N2 and transistor 43. External signal terminals A21 to A23, etc. are connected to gates of a plurality of the transistors 72 via inverters 73 respectively, and reverse signals of signals from the external signal terminals A21 to A23, etc. are inputted therein.

The switch circuit 64 is a circuit in which the transistors 71 corresponding to the transistor 44 of the first embodiment are connected in two lines or more in parallel. The switch circuit 65 is a circuit in which the transistors 72 corresponding to the transistor 47 of the first embodiment are connected in two lines or more in parallel. Different external signal terminals A21 to A23, etc. are respectively connected to respective gates of the transistors 71 and 72 forming the switch circuits 64 and 65 with 1 to 1.

The switch circuits 64 and 65 are connected if at least one of a plurality of the external signal terminal A21 to A23 is at a low level (instruction for connection), and are disconnected if none are at a low level (instruction for connection).

In other words, when the power supply voltage detection signal terminal A1 is at a high level (power supply voltage is a prescribed value V1 or more), switches 46 and 71 in the path between the power supply voltage terminal VDD and the node terminal N1 connect the path between the power supply voltage terminal VDD and the node terminal N1 if at least one out of signals from a plurality of external signal terminals A21 to A23, etc. is at a low level (instruction for connection), and disconnected the path between the power supply voltage terminal VDD and the node terminal N1 if none are at a low level (instruction for connection).

Similarly, in the case that the power supply voltage detection signal terminal A1 is in a high level (the power supply voltage is a prescribed value V1 or more), the switches 42 and 72 in the path between the node terminal N2 and the ground terminal connect the path between the ground terminal and the node terminal N2 if at least one out of signals from a plurality of the external signal terminals A21 to A23, etc. is at a low level (instruction for connection), and disconnected the path between the ground terminal and the node terminal N2 if none are at a low level (instruction for connection).

When at least one out of signals from a plurality of the external signal terminals A21 to A23, etc. becomes a low level, the transistors 71 and 72 are ON, and perform the same operation as when the transistors 44 and 47 in FIG. 1 are ON. Namely, they perform the operation at time t2 in FIG. 2, and thereafter, it becomes possible to detect power supply voltage.

Fifth Embodiment

Figure 7:
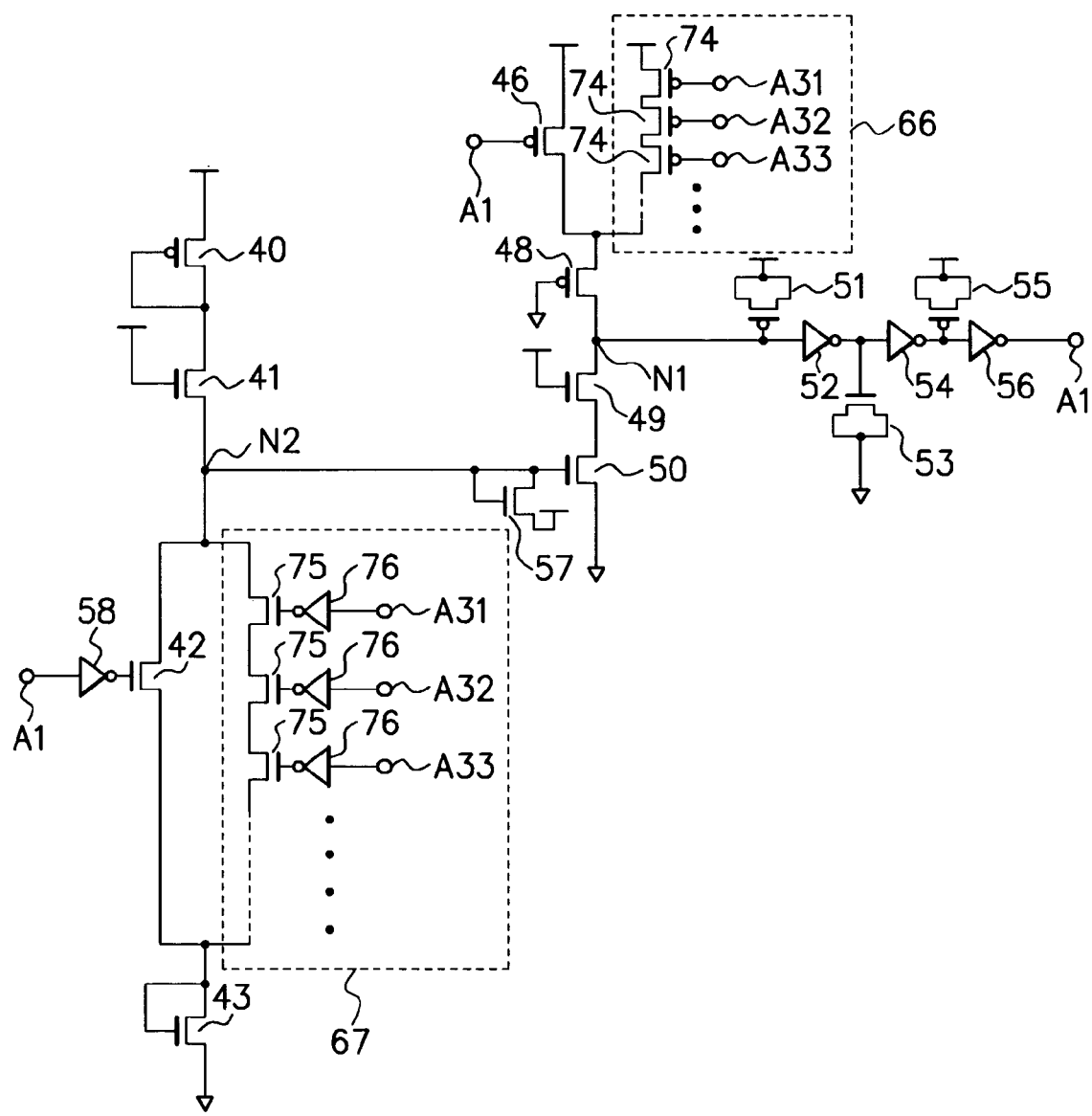
FIG. 7 is a circuit diagram showing a configuration example of a power supply voltage detection circuit according to a fifth embodiment of the present invention.

FIG. 7 is a circuit diagram showing a configuration example of the power supply voltage detection circuit according to the fifth embodiment of the present invention. Points in the present embodiment different from the first embodiment will be explained hereinafter. The present embodiment provides a circuit in which the transistors 44 and 47, and the inverter 59 in the first embodiment (FIG. 1) are taken away, and switch circuits 66 and 67 are added.

The switch circuit 66 includes a plurality of P-channel transistors 74 connected between sources of the power supply voltage terminal VDD and the transistor 48 in series. Signals from external signal terminals A31 to A33, etc. are inputted respectively to gates of a plurality of transistors 74.

The switch circuit 67 includes a plurality of N-channel transistors 75 connected between drains of the node terminal N2 and transistor 43 in series. External signal terminals A31 to A33, etc. are connected to gates of a plurality of the transistors 75 via inverters 76 respectively, and reverse signals of signals from the external signal terminals A31 to A33, etc. are inputted therein.

The switch circuit 66 is a circuit in which the transistors 74 corresponding to the transistor 44 of the first embodiment are connected in two tiers or more in series. The switch circuit 67 is a circuit in which the transistors 75 corresponding to the transistor 47 of the first embodiment are connected in two tiers or more in series. Different external signal terminals A31 to A33, etc. are respectively connected to respective gates of the transistors 74 and 75 forming the switch circuits 66 and 67 with 1 to 1.

The total size (resistance value) of all transistors 74 in the switch circuit 66 is adjusted to be the same size (resistance value) as that of the transistor 46. The total size (resistance value) of all transistors 75 in the switch circuit 67 is adjusted to be the same size (resistance value) as that of the transistor 42.

The switch circuits 66 and 67 connect the path if all signals from a plurality of the external signal terminals A31 to A33, etc. are at a low level (instruction for connection), and disconnect it if there is at least one not at a low level (instruction for connection).

In other words, in the case that signals from the power supply voltage detection signal terminals A1 are in a high level (the power supply voltage is equal to or above the prescribed value V1), the switches 46 and 66 connect the path between the power supply voltage terminal VDD and the node terminal N1 if all signals from a plurality of the external signal terminals A31 to A33 are at a low level (instruction for connection), and disconnect the path between the power supply voltage terminal VDD and the node terminal N1 if at least one is not at a low level (instruction for connection).

Similarly, in the case that the power supply voltage detection signal terminal A1 is in a high level (the power supply voltage is a prescribed value V1 or more), the switches 42 and 67 connect a path between the ground terminal and the node terminal N2 if all signals from a plurality of the external signal terminals A31 to A33, etc. are at a low level (instruction for connection), but otherwise disconnect the path between the ground terminal and the node terminal N2 if there is at least one not at a low level (instruction for connection).

When all signals from a plurality of the external signal terminals A31 to A33, etc. become low level, the switches 66 and 67 are ON, and perform the same operation as when the transistors 44 and 47 in FIG. 1 are ON, namely, the same operation as that at time t2 in FIG. 2, and thereafter, it becomes possible to detect power supply voltages.

Sixth Embodiment

Figure 8:
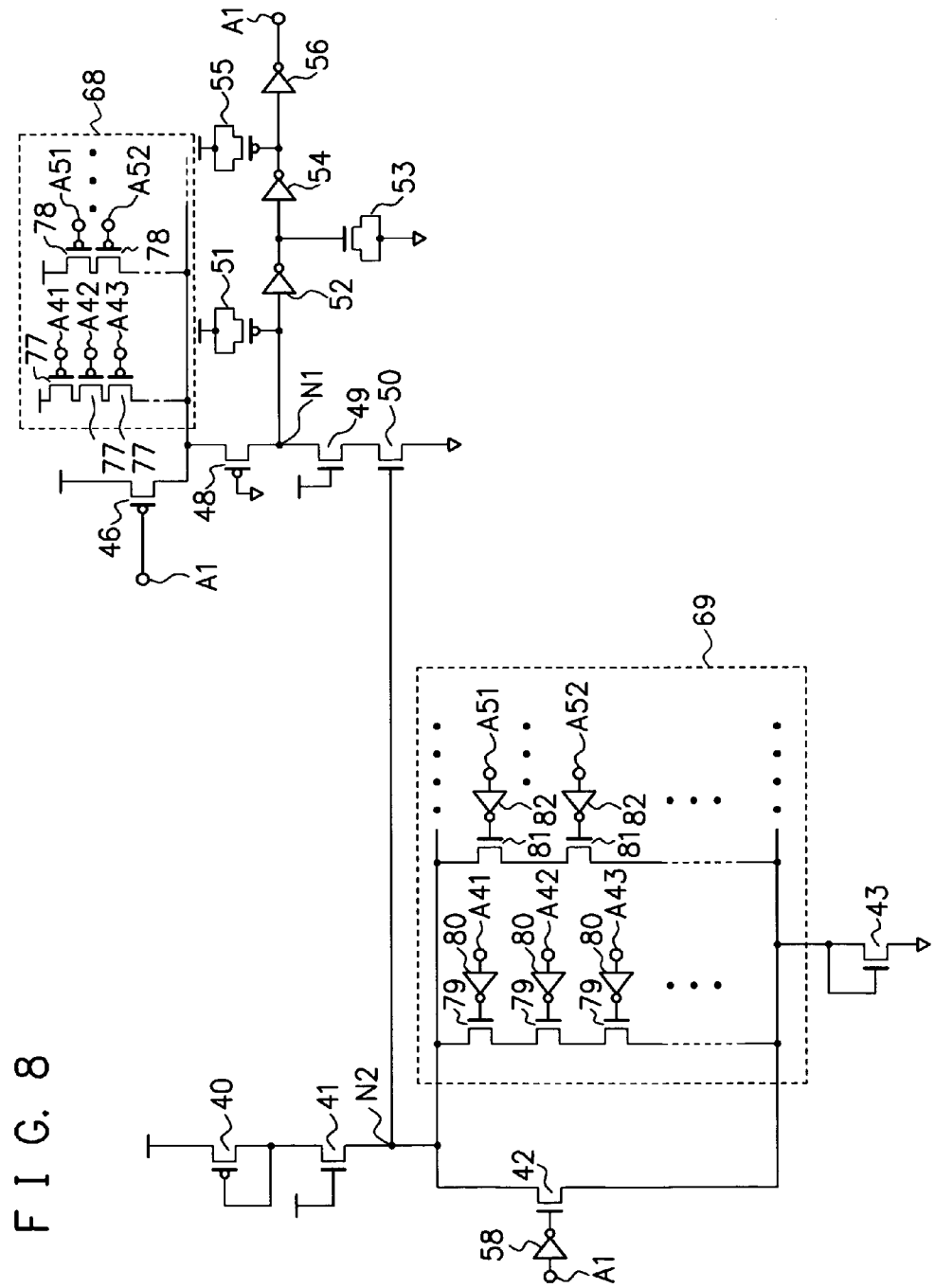
FIG. 8 is a circuit diagram showing a configuration example of a power supply voltage detection circuit according to a sixth embodiment of the present invention.
Figure 9:
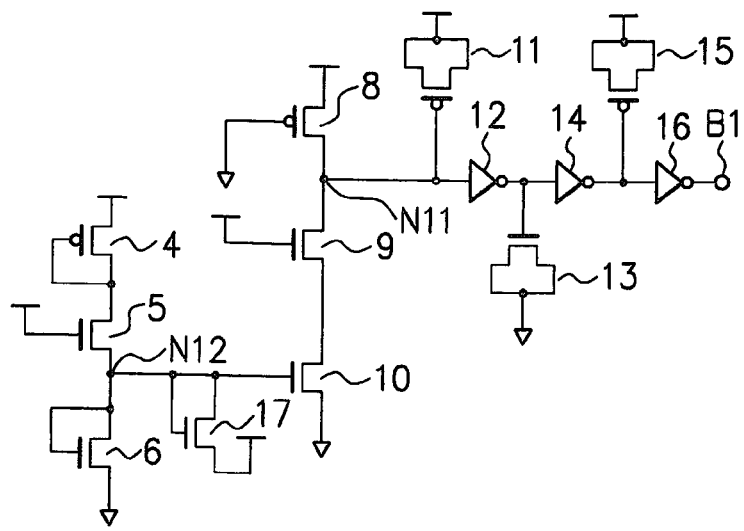
FIG. 9 is a circuit diagram showing a configuration example of a power supply voltage detection circuit.
Figure 10:
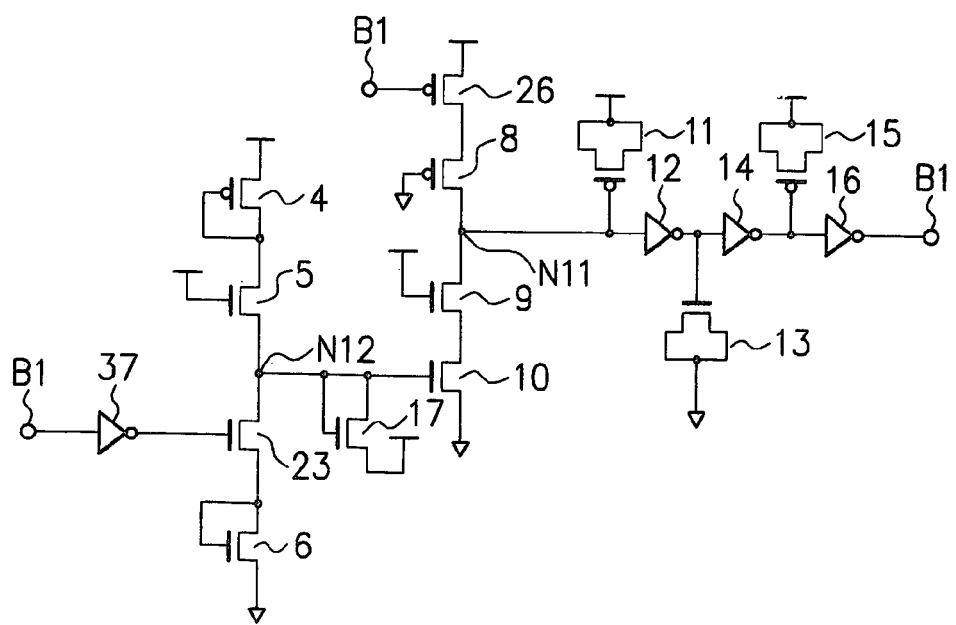
FIG. 10 is a circuit diagram showing a configuration example of another power supply voltage detection circuit.

FIG. 8 is a circuit diagram showing a configuration example of the power supply voltage detection circuit according to the sixth embodiment of the present invention. Points in the present embodiment different from the first embodiment will be explained hereinafter. The present embodiment is a combination of the fourth embodiment and the fifth embodiment. The present embodiment provides a circuit in which the transistors 44 and 47, and the inverter 59 in the first embodiment (FIG. 1) are taken away, and switch circuits 68 and 69 are added.

External signals are classified into external signals of a plurality of groups. External signal terminals A41 to A43, etc. are external signal terminals forming the first group. External signal terminals A51 to A52, etc. are external signal terminals forming the second group.

A switch circuit 68 is connected in parallel with the switch 46, and include a serial connection of mutually parallel connected plural P-channel transistors 77. Signals from the plural first group external signal terminals A41 to A43 are inputted into respective gates of transistors 78 forming the first serial connection. Signals from the plural second group external signal terminals A51 to A52 are inputted into respective gates of transistors 78 forming the second serial connection.

A switch circuit 69 is connected in parallel with the switch 42, and includes a serial connection of mutually parallel connected plural N-channel transistors 79. The plural first group external signal terminals A41 to A43, etc. are connected to respective gates of the transistors 79 forming the first serial connection via an inverter 80, and reverse signals of signals from the external signal terminals A41 to A43, etc. are inputted thereto. The plural second group external signal terminals A51 to A52, etc. are connected to respective gates of the transistors 79 forming the second serial connection via the inverter 80, and reverse signals of signals from the external signal terminals A51 to A52, etc. are inputted thereto.

The switch circuits 68 and 69 are ON when all of plural external signals in the first or the second groups are at a low level (instruction for connection), but otherwise, are OFF. For instance, when all external signals A41 to A43, etc. in the first group are at a low level, the switch circuits 68 and 69 are ON. Though this condition is not satisfied, if all external signals A51 to A52, etc. in the second group are at a low level, the switch circuits 68 and 69 are ON.

In other words, in the case that a signal from the power supply voltage detection signal terminal A1 is in a high level (the power supply voltage is a prescribed value V1 or more), the switches 46 and 68 connect a path between the power supply voltage terminal VDD and the node terminal N1 if all of the plural external signals in the first and second groups are at a low level (instruction for connection), but otherwise, disconnect the path between the power supply voltage terminal VDD and the node terminal N1.

Similarly, in the case that signal of the power supply voltage detection signal terminal A1 is in a high level (the power supply voltage is a prescribed value V1 or more), the switches 42 and 69 connect a path between the ground terminal and the node terminal N2 if all of the plural external signals in the first or second groups are at a low level (instruction for connection), but otherwise, disconnect the path between the ground terminal and the node terminal N2.

In the present embodiment, it becomes possible to detect power supply voltages only when a combined signal of external signals according to necessity is activated at a low level.

It should be noted that in the first to sixth embodiments, though an explanation is made for a case that a power supply voltage detection circuit is activated when an external signal comes to have a low level, the present invention is also applicable to the case where the power supply voltage detection circuit is activated when the external signal has a level corresponding to a predetermined high level, if input logic of an external signal in respective embodiments is reversed.

As described above, by inputting an external signal which is an operation signal of a semiconductor circuit into a power supply voltage detection circuit, it is possible to keep the power supply voltage detection circuit in a state of full-time source monitoring and detect an abnormal voltage in operation while a specific operation signal in the semiconductor circuit is being activated. When an operation signal of the semiconductor circuit is in a deactivated state, it is possible to reduce power consumption to nearly zero by disconnecting all paths between the power supply voltage terminal VDD of the power supply voltage detection circuit and the ground terminal. In other words, by controlling activating/deactivating of a specific operation signal, it is possible to set a term during which the monitoring by the power supply voltage detection circuit is necessary and, furthermore, to reduce power consumption to nearly zero during a term 0 unnecessary to monitor the source. It is also possible to detect the leading edge and falling edge of a power supply voltage, and to suppress power consumption.

As described above, by using an external signal, it is possible to detect a leading edge and a falling edge of a power supply voltage, and suppress power consumption.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A power supply voltage detection circuit, comprising:
    a first switch to connect between a power supply voltage terminal and a first terminal according to a power supply voltage detection signal and an external signal;
    a second switch to connect between a reference potential terminal and a second terminal according to the power supply voltage detection signal and the external signal;
    a first resistance connected between said second terminal and the power supply voltage terminal;
    a third switch to connect between said first terminal and the reference potential terminal according to a voltage of said second terminal; and
    an output circuit to output said power supply voltage detection signal based on a signal from said first terminal;
    wherein said first switch includes fourth and fifth switches connected in parallel between the power supply voltage terminal and said first terminal;
    wherein said fourth switch connects between the power supply voltage terminal and said first terminal according to said power supply voltage detection signal;
    wherein said fifth switch connects between the power supply voltage terminal and said first terminal according to said external signal;
    wherein said second switch includes sixth and seventh switches connected in parallel between the reference potential terminal and said second terminal;
    wherein said sixth switch connects between the reference potential terminal and said second terminal according to said power supply voltage detection signal; and
    wherein said seventh switch connects between the referential potential terminal and said second terminal according to said external signal.

2. The power supply voltage detection circuit according to claim 1, wherein said fourth and fifth switches are connected to said first terminal via the same resistance.

3. The power supply voltage detection circuit according to claim 1, wherein said fourth and fifth switches are connected to said first terminal via different resistances.

4. The power supply voltage detection circuit according to claim 1, wherein
    said fourth switch is a first P-channel field-effect transistor, to the gate thereof said power supply voltage detection signal being inputted;
    said fifth switch is a second P-channel field-effect transistor, to the gate thereof said external signal being inputted;

said sixth switch is a first N-channel field-effect transistor, to the gate thereof a reverse signal of said power supply voltage detection signal being inputted; and said seventh switch is a second N-channel field effect transistor, to the gate thereof a reverse signal of said external signal being inputted.

5. The power supply voltage detection circuit according to claim 4, wherein said first and second P-channel field-effect transistors are connected to said first terminal via the same resistance.

6. The power supply voltage detection circuit according to claim 4, wherein said first and second P-channel field-effect transistors are connected to said first terminal via different resistances.

* * * * *